(12) United States Patent
Hwang

(10) Patent No.: US 8,824,155 B2
(45) Date of Patent: Sep. 2, 2014

(54) FLAT PANEL DISPLAY DEVICE

(75) Inventor: Se Ja Chul Hwang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 393 days.

(21) Appl. No.: 13/222,786

(22) Filed: Aug. 31, 2011

(65) Prior Publication Data

US 2012/0113607 A1    May 10, 2012

(51) Int. Cl.
    *H05K 5/00* (2006.01)

(52) U.S. Cl.
    USPC ........................................................ 361/756

(58) Field of Classification Search
    USPC ........................................................ 361/756
    See application file for complete search history.

(56) References Cited

U.S. PATENT DOCUMENTS

| | | | | |
|---|---|---|---|---|
| 6,567,274 B1 * | 5/2003 | Tusan et al. | ................... | 361/740 |
| 7,477,528 B2 * | 1/2009 | Kim | ............................... | 361/825 |
| 8,369,107 B2 * | 2/2013 | Cho et al. | ...................... | 361/829 |
| 2003/0169573 A1 * | 9/2003 | Irie et al. | ........................ | 361/752 |
| 2004/0195969 A1 * | 10/2004 | Kim et al. | ...................... | 313/583 |
| 2009/0257806 A1 * | 10/2009 | Dewey | ........................... | 400/354 |
| 2011/0188179 A1 * | 8/2011 | Myers et al. | ............. | 361/679.01 |
| 2012/0028679 A1 * | 2/2012 | Ozasa | ........................ | 455/556.1 |

FOREIGN PATENT DOCUMENTS

| | | |
|---|---|---|
| JP | 2002-093573 | 3/2002 |
| KR | 10-2001-0088741 | 9/2001 |

* cited by examiner

Primary Examiner — Forrest M Phillips
(74) Attorney, Agent, or Firm — Robert E. Bushnell, Esq.

(57) ABSTRACT

A flat panel display device with an improved structure reducing the number of components and assembling processes comprises: a panel including a first substrate, an emission unit formed on the first substrate, and a second substrate coupled to the first substrate so as to seal the emission unit and including a flange portion having a first coupling hole; a monitor frame having a second coupling hole corresponding to the first coupling hole; and a fastener for coupling the panel and the monitor frame by being inserted into the first coupling hole. In this structure, the flange portion is used to couple the monitor frame to the panel, and thus a separate fixing frame is not used. The lack of need for the fixing frame leads to a fewer number of components and assembling processes.

14 Claims, 2 Drawing Sheets

FLAT PANEL DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 9 Nov. 2010 and there duly assigned Serial No. 10-2010-0111563.

BACKGROUND OF THE INVENTION

1. Field of the Invention

The present invention relates to a flat panel display device, and more particularly to a flat panel display device in which a coupled structure of a panel and a monitor frame is improved.

2. Description of the Related Art

Recently, research into flat panel display devices, such as an organic light emitting display device, is actively being performed since they can be manufactured as thin or flexible devices with respect to driving characteristics.

Conventionally, a flat panel display device is manufactured by the following method. An emission unit is formed on a first substrate and a second substrate is formed to seal the emission unit, thereby manufacturing a panel. A fixing frame is coupled to the panel, and then the fixing frame is coupled to a monitor frame which forms an outer appearance of the flat panel display.

Accordingly, since in this structure, the fixing frame is necessarily used as an intermediate medium for coupling the panel to the monitor frame, the number of components is high and the manufacturing process is complicated.

SUMMARY OF THE INVENTION

The present invention provides a flat panel display device in which a coupled structure of a panel and a monitor frame is improved so as not to use a fixing frame.

According to an aspect of the present invention, a flat panel display device comprises: a panel including a first substrate, an emission unit formed on the first substrate, and a second substrate which is coupled to the first substrate to seal the emission unit and which includes a flange portion having a first coupling hole; a monitor frame having a second coupling hole corresponding to the first coupling hole; and a fastener for coupling the panel and the monitor frame by being inserted into the first coupling hole and the second coupling hole.

The first substrate includes glass.

The second substrate includes metal, such as carbon alloy, stainless steel, or aluminum.

The flange portion is formed at an edge of the second substrate.

The flat panel display device may further include a guide member which is coupled to the flange portion so as to prevent misalignment of the panel and the monitor frame. The guide member may be coupled to the flange portion by welding.

The guide member may have a third coupling hole which overlaps the first coupling hole, and the fastener fits into the first coupling hole, the second coupling hole, and the third coupling hole.

The guide member includes metal, such as carbon alloy, stainless steel, or aluminum

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to the attached drawings.

Figure 1:
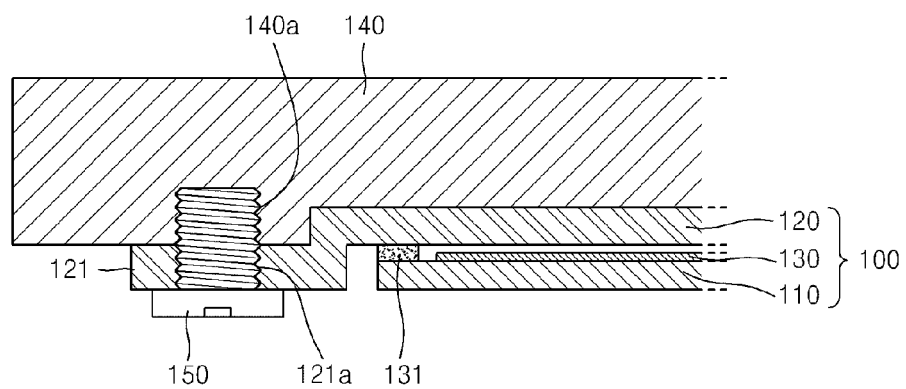
FIG. 1 is a cross-sectional view of a major part of a flat panel display device according to an embodiment of the present invention.
Figure 2:
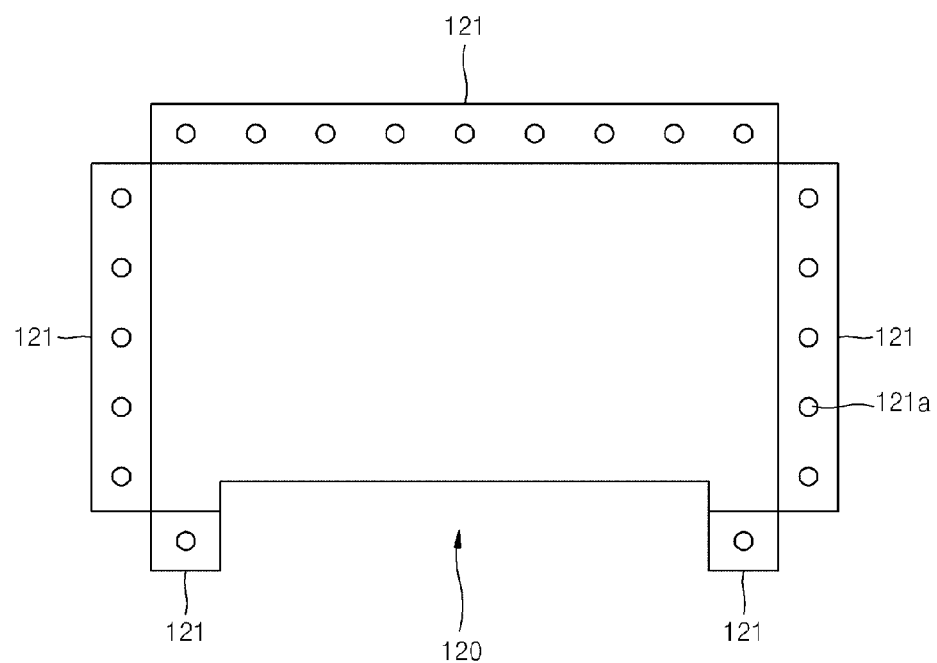
FIG. 2 is a plan view of a second substrate of the flat panel display device of FIG. 1.

FIG. 1 is a cross-sectional view of a major part of a flat panel display device according to an embodiment of the present invention, and FIG. 2 is a plan view of a second substrate of the flat panel display device of FIG. 1.

Referring to FIG. 1, the flat panel display device according to the present embodiment includes a panel 100 for forming an image and a monitor frame 140 which is coupled to the panel 100.

The panel 100 includes a first substrate 110, an emission unit 130 formed on the first substrate 110, and a second substrate 120 which is coupled to the first substrate 110 so as to cover the emission unit 130.

The emission unit 130 may be an organic emission unit which includes electrodes facing each other and an organic layer interposed between the electrodes.

The first substrate 110 may be formed of a glass material.

The second substrate 120 covers the emission unit 130 so as to prevent permeation of water molecules into the emission unit 130, and may be formed of metal, such as carbon alloy, stainless steel, or aluminum.

A sealant 131 couples the first substrate 110 to the second substrate 120 and seals the first and second substrates 110 and 120, respectively. The sealant 131 may be, for example, a frit, which is a source material for glass. In general, a frit hardens by laser exposure. Accordingly, when the sealant 131 is placed between the first substrate 110 and the second substrate 120 and laser is irradiated onto the sealant 131, the sealant 131 hardens, thereby rigidly coupling and sealing the first and second substrates 110 and 120, respectively.

In this regard, as illustrated in FIGS. 1 and 2, a flange portion 121 having a first coupling hole 121a is formed at an edge of the second substrate 120 as one body with the second substrate 120.

The flange portion 121 acts as a conventional fixing frame. That is, a separate fixing frame is not used, and the flange portion 121 is formed as one body with the second substrate 120 so as to function as a fixing frame.

The monitor frame 140 includes a second coupling hole 140a corresponding to the first coupling hole 121a of the flange portion 121. Accordingly, the panel 100 is coupled to the monitor frame 140 by inserting a fastener 150, for example, a screw or a bolt, into the first and second holes 121a and 140a, respectively.

The flat panel display device described above may be assembled by the following method.

First, the panel 100 is prepared.

In the panel 100, as described above, the first and second substrates 110 and 120, respectively, are coupled to each other and are sealed with the sealant 131, for example, a frit, and the emission unit 130 is placed in the sealed space.

Also, the second substrate 120 and the flange portion 121 are formed as one body, thereby enabling the second substrate 120 and the monitor frame 140 to be coupled without use of a separate medium.

Subsequently, the monitor frame 140 is prepared, and the panel 100 and the monitor frame 140 are arranged such that the first coupling hole 121a of the flange portion 121 and the second coupling hole 140a of the monitor frame 140 overlap.

Then, the fastener 150 is inserted into the aligned first and second coupling holes 121a and 140a, respectively.

Therefore, the panel 100 is coupled to the monitor frame 140 via the fastener 150 so as to maintain the panel 100 rigidly fixed to the monitor frame 140.

Accordingly, since in the flat panel display device described above, the monitor frame 140 is coupled to the panel 100 using the flange portion 121 of the second substrate 120 as an encapsulation substrate, a separate fixing frame is not needed. The lack of need for a fixing frame leads to fewer numbers of components and assembling processes.

Figure 3:
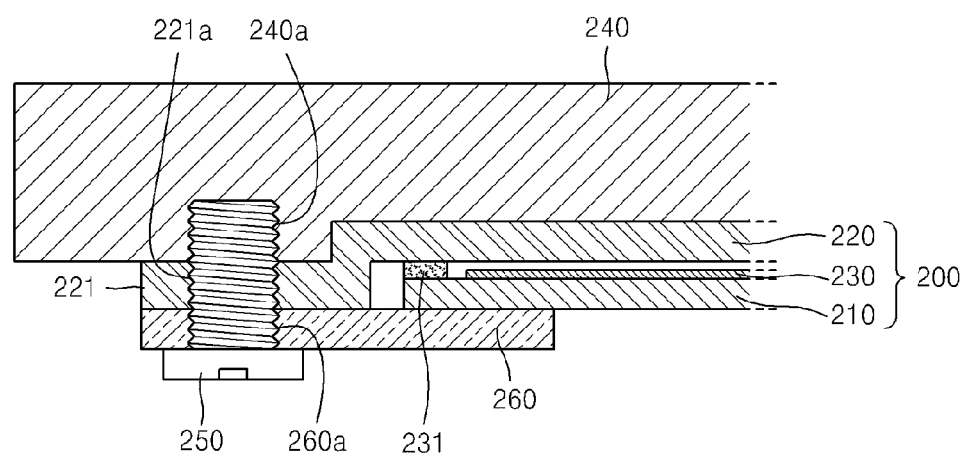
FIG. 3 is a cross-sectional view of a major part of a flat panel display device according to another embodiment of the present invention.

FIG. 3 is a cross-sectional view of a major part of a flat panel display device according to another embodiment of the present invention.

Referring to FIG. 3, like the flat panel display device according to the previous embodiment, the flat panel display device according to the present embodiment includes a panel 200 for forming an image and a monitor frame 240 which is coupled to the panel 200.

The panel 200 includes a first substrate 210, an emission unit 230 formed on the first substrate 210, and a second substrate 220 which is coupled to the first substrate 210 so as to cover the emission unit 230.

The emission unit 230 may be an organic emission unit which includes electrodes facing each other and an organic layer interposed between the electrodes.

The first substrate 210 may be formed of a glass material.

The second substrate 220 covers the emission unit 230 so as to prevent permeation of water molecules into the emission unit 230, and may be formed of metal, such as carbon alloy, stainless steel, or aluminum.

A sealant 231 couples the first substrate 210 to the second substrate 220 and seals the first and second substrates 210 and 220, respectively. The sealant 231 may be, for example, a frit, which is a source material for glass. In general, a frit hardens by laser exposure. Accordingly, when the sealant 231 is placed between the first substrate 210 and the second substrate 220 and laser is irradiated onto the sealant 231, the sealant 231 hardens, thereby rigidly coupling and sealing the first and second substrates 210 and 220, respectively.

In this regard, as illustrated in FIG. 3, a flange portion 221 having a first coupling hole 221a is formed at an edge of the second substrate 220 as one body with the second substrate 220.

The flange portion 221 acts as a conventional fixing frame. That is, a separate fixing frame is not used, and the flange portion 221 is formed as one body with the second substrate 220 so as to function as a fixing frame.

The monitor frame 240 includes a second coupling hole 240a corresponding to the first coupling hole 221a. Accordingly, when a fastener 250, for example, a screw or a bolt, is inserted into the first and second holes 221a and 240a, respectively, the panel 200 is coupled to the monitor frame 240.

Also, the flat panel display device according to the present embodiment may further include a guide member 260 which is coupled to the second substrate 220 so as to prevent misalignment of the panel 200. The guide member 260 may have a third coupling hole 260a. Like the second substrate 220, the guide member 260 may be formed of metal, such as carbon alloy, stainless steel, or aluminum. Although the guide member 260 is coupled to the second substrate 220 via the fastener 250, more rigid coupling is needed to ensure the prevention of misalignment of the panel 200. Thus, the guide member 260 may be coupled to the second substrate 220 by welding before the guide member 260 is coupled to the second substrate 220 via the fastener 250.

The flat panel display device described above may be assembled by the following method.

First, the panel 200 is prepared.

Regarding the panel 200, as described above, the first and second substrates 210 and 220, respectively, are coupled to each other and are sealed with the sealant 231, for example, a frit, and the emission unit 230 is placed in the sealed space.

Also, the second substrate 220 and the flange portion 221 are formed as one body, thereby enabling the second substrate 220 and the monitor frame 240 to be coupled without use of a separate medium.

Then, the guide member 260 is fixed to the flange portion 221 of the second substrate 220 by welding. The guide member 260 and the panel 200 are arranged so that the third coupling hole 260a and the first coupling hole 221a overlap and, in this arrangement state, the welding process is performed thereon.

Then, the monitor frame 240 is prepared and arranged so that the first coupling hole 221a of the flange portion 221, the third coupling hole 260a of the guide member 260, and the second coupling hole 240a of the monitor frame 240 overlap.

Then, the fastener 250 is inserted into the first, second and third holes 221a, 240a, and 260a, respectively.

Therefore, the panel 200 is coupled to the monitor frame 240 via the fastener 250 so as to maintain the panel 200 rigidly fixed to the monitor frame 240.

Accordingly, since in the flat panel display device described above, the panel 200 is coupled to the monitor frame 240 using the flange portion 221 of the second substrate 220 as an encapsulation substrate, a separate fixing frame is not needed. The lack of need for a fixing frame leads to a fewer number of components and assembling processes.

Also, since a side of the guide member 260, as illustrated in FIG. 3, prevents misalignment of the panel 200, the coupling between the monitor frame 240 and the panel 200 may be further stabilized.

The flat panel display device according to the above embodiments of the present invention does not need a separate fixing frame. The lack of need for the fixing frame leads to a fewer number of components and assembling processes.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A flat panel display device comprising:
    a panel including a first substrate, an emission unit formed on the first substrate, and a second substrate coupled to the first substrate so as to seal the emission unit and including a flange portion having a first coupling hole;
    a monitor frame having a second coupling hole corresponding to the first coupling hole; and
    a fastener for coupling the panel and the monitor frame by being inserted into the first coupling hole and the second coupling hole.

2. The flat panel display device of claim 1, wherein the first substrate comprises glass.

3. The flat panel display device of claim 1, wherein the second substrate comprises metal.

4. The flat panel display device of claim 3, wherein the metal comprises one of a carbon alloy, stainless steel and aluminum.

5. The flat panel display device of claim 1, wherein the flange portion is formed at an edge of the second substrate.

6. The flat panel display device of claim 1, further comprising a guide member coupled to the flange portion so as to prevent misalignment of the panel and the monitor frame.

7. The flat panel display device of claim 6, wherein the guide member is coupled to the flange portion by welding.

8. The flat panel display device of claim 6, wherein the guide member has a third coupling hole which overlaps the first coupling hole, and wherein the fastener fits through the first coupling hole, the second coupling hole and the third hole.

9. The flat panel display device of claim 6, wherein the guide member comprises metal.

10. The flat panel display device of claim 9, wherein the metal comprises one of carbon alloy, stainless steel and aluminum.

11. A flat panel display device comprising:
- a flat panel display unit including a first substrate, an emission unit formed on the first substrate, and a second substrate coupled to the first substrate so as to seal the emission unit between the first substrate and the second substrate, the second substrate including a flange portion having a first coupling hole;
- the emission unit and the second substrate being spaced-apart;
- a monitor frame having a second coupling hole corresponding to the first coupling hole; and
- a fastener extending through the first coupling hole and the second coupling hole and for coupling the panel and the monitor frame together.

12. The flat panel display device of claim 11, wherein the first substrate comprises glass.

13. The flat panel display device of claim 11, wherein the second substrate comprises metal.

14. The flat panel display device of claim 13, wherein the metal comprises one of a carbon alloy, stainless steel and aluminum.

* * * * *